US011869988B2

United States Patent
Liu

(10) Patent No.: US 11,869,988 B2
(45) Date of Patent: Jan. 9, 2024

(54) DOUBLE-SIDED STACKED DTC STRUCTURE

(71) Applicant: Taiwan Semiconductor Manufacturing Company, Ltd., Hsinchu (TW)

(72) Inventor: Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

(21) Appl. No.: 17/412,622

(22) Filed: Aug. 26, 2021

(65) Prior Publication Data

US 2023/0060324 A1   Mar. 2, 2023

(51) Int. Cl.
| | |
|---|---|
| H01L 29/94 | (2006.01) |
| H01L 29/66 | (2006.01) |
| H01L 23/31 | (2006.01) |
| H01L 23/522 | (2006.01) |
| H01L 23/532 | (2006.01) |
| H01L 49/02 | (2006.01) |

(52) U.S. Cl.
CPC ........ *H01L 29/945* (2013.01); *H01L 23/3157* (2013.01); *H01L 23/5226* (2013.01); *H01L 23/53209* (2013.01); *H01L 28/60* (2013.01); *H01L 29/66181* (2013.01)

(58) Field of Classification Search
None
See application file for complete search history.

(56) References Cited

U.S. PATENT DOCUMENTS

| | | | |
|---|---|---|---|
| 2012/0181661 A1* | 7/2012 | Booth, Jr. | ......... H01L 29/66181 |
| | | | 438/455 |
| 2014/0035158 A1* | 2/2014 | Chang | ..................... H01L 24/08 |
| | | | 438/109 |
| 2017/0053979 A1* | 2/2017 | Voiron | .............. H01L 29/66181 |
| 2019/0348496 A1 | 11/2019 | Murase et al. | |
| 2020/0091063 A1* | 3/2020 | Chen | ................... H01L 25/0657 |
| 2021/0159187 A1 | 5/2021 | Hsieh et al. | |

FOREIGN PATENT DOCUMENTS

CN    112151535 A  * 12/2020  ......... H01L 21/8221

* cited by examiner

*Primary Examiner* — Khaja Ahmad
(74) *Attorney, Agent, or Firm* — Eschweiler & Potashnik, LLC

(57) ABSTRACT

In some embodiments, the present disclosure relates to an integrated circuit (IC), including a first insulating layer which includes a first metal interconnect structure stacked above a bottom die. Including a substrate disposed above the first insulating layer, a second metal interconnect structure disposed above the substrate, a through-substrate via (TSV) directly connecting the first metal interconnect structure to the second metal interconnect structure, and a stacked deep trench capacitor (DTC) structure disposed in the substrate. The DTC structure includes a first plurality of trenches extending from a first side of the substrate and a second plurality of trenches extending from a second side of the substrate.

20 Claims, 11 Drawing Sheets

DOUBLE-SIDED STACKED DTC STRUCTURE

BACKGROUND

The integrated circuit (IC) manufacturing industry has experienced exponential growth recently. The evolution of ICs has led to an increase in functional density and a decrease in geometrical size. A deep trench capacitor (DTC) is one feature that can be found on ICs and comprises one or more trenches within a substrate. DTCs are used to add capacitance to various ICs. As technology is developed to be smaller and more efficient, manufacturing methods often need to be adjusted to accommodate for the smaller dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
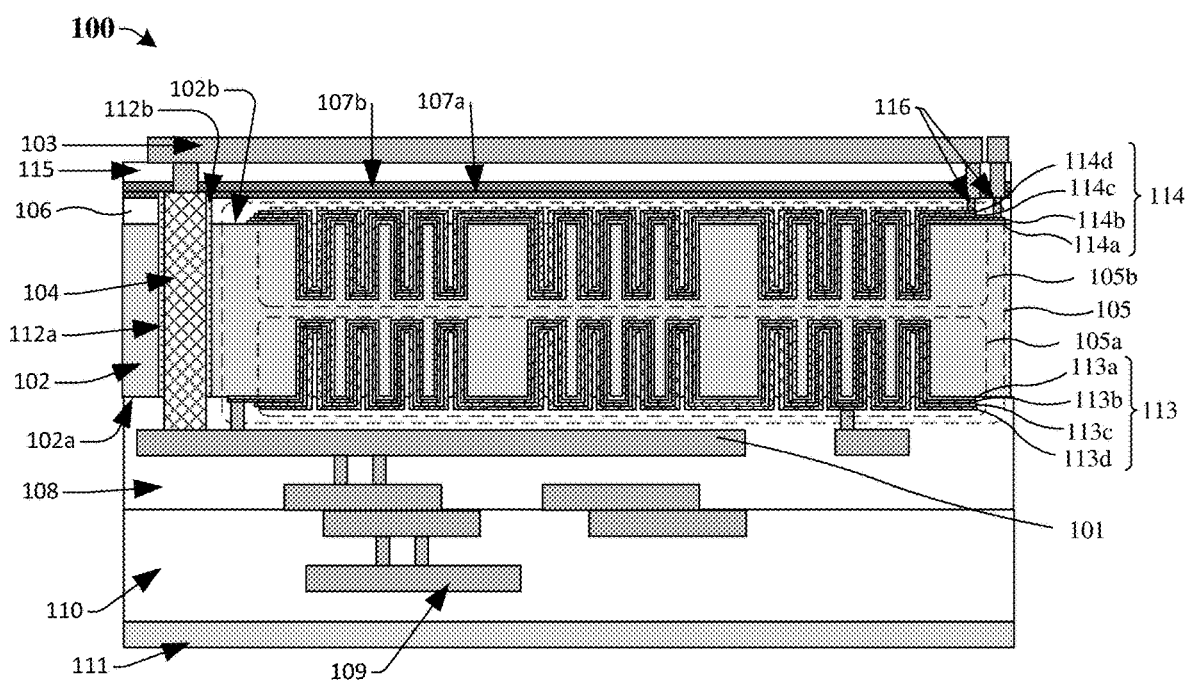
FIG. 1 illustrates a cross-sectional view of some embodiments of an IC comprising a stacked deep trench capacitor structure in a single substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A deep trench capacitor (DTC) comprises one or more trenches within a substrate. Each trench of the one or more trenches comprises a DTC stack comprising an outer electrode, an inner electrode, and a dielectric layer separating the inner and outer electrodes. DTCs are used to add capacitance to various integrated circuits. As technology is developed to be smaller and more efficient, manufacturing methods often need to be adjusted to accommodate for the smaller dimensions.

Typically, a DTC structure may be formed by etching trenches into two separate wafers. The DTC stack is then deposited in each trench. A frontside of each wafer is temporarily bonded to a glass structure, and a backside of each wafer is then thinned down. The two wafers are then bonded backside to backside using a bonding layer, such that there are one or more upper trenches stacked above one or more lower trenches. Then, the DTC structure is embedded in a packaging substrate. The packaging substrate is attached to a die by solder bumps.

The methodology behind DTC structure formation is complex and expensive. To form the DTC structure, two separate wafers have trenches etched into them and a DTC stack formed within them. After this, both wafers have to undergo a thin down process and then they are bonded together. Providing two separate wafers and performing two trim down processes is cost ineffective. Although stacking a layer of upper trenches above a layer of bottom trenches increases capacitance, because two separate wafers are bonded together, the DTC structure must be embedded in the package substrate. Due to the size of the connecting solder bumps, a distance between the DTC structure and the attached die can exceed 600 um, and this large distance causes an equivalent series resistance of the structure to also be large. Embedding the DTC structure in the package substrate has a negative impact on the equivalent series resistance of the structure.

In the present disclosure, a new method of manufacturing DTC structures is presented to produce more cost effective and efficient integrated circuits. The new manufacturing method forms a layer of upper trenches and a layer of lower trenches within a single wafer. A through-substrate via (TSV) is used to connect the attached die to each side of the DTC structure, allowing the single-wafer structure to be embedded within the die itself. Further, the single wafer process requires only a single thin down process. This single layer structure can also reduce the equivalent series resistance compared to DTCs that utilize two separate substrates, and thereby provides enhanced functionality compared to DTCs on two separate substrates.

FIG. 1 illustrates a cross-sectional view 100 of some embodiments of an IC comprising a stacked deep trench capacitor structure. The IC comprises a first insulating layer 108 comprising a metal interconnect structure 101 stacked above a die 111. A semiconductor substrate 102 is disposed above the first insulating layer 108. The semiconductor substrate 102 comprises a DTC structure 105 comprising a first plurality of trenches 105a extending from a first side of the semiconductor substrate 102 and a second plurality of trenches 105b extending from a second side of the semiconductor substrate 102. Each trench of the first plurality of trenches 105a comprises a first DTC stack 113 configured to provide the IC with a capacitance, the first DTC stack 113 comprising a first inner dielectric layer 113a directly contacting the semiconductor substrate 102, a first inner electrode 113b, a first capacitor dielectric 113c, and a first outer electrode 113d. The first capacitor dielectric 113c separates the first inner electrode 113b from the first outer electrode 113d, and the first inner dielectric layer 113a separates the first inner electrode 113b from the semiconductor substrate 102. Each trench of the second plurality of trenches 105b comprises a second DTC stack 114 configured to provide the IC with a capacitance, the second DTC stack 114 comprising a second inner dielectric layer 114a directly contacting the semiconductor substrate 102, a second inner electrode 114b, a second capacitor dielectric 114c, and a second outer electrode 114d. The second capacitor dielectric 114c separates the second inner electrode 114b from the second outer electrode 114d, and the second inner dielectric layer 114a separates the second inner electrode 114b from the semiconductor substrate 102. In some embodiments, the DTC structure 105 may be less than 30 um away from the die 111. In some embodiments, the first DTC stack 113 and the second DTC stack 114 may comprise additional metal layers and additional insulating layers, such that an insulating layer separates each metal layer. In some embodiments, the first inner electrode 113b and the second inner electrode 114b may each have a first thickness ranging from 10 Angstroms to 1000 Angstroms. In some embodiments, the first outer electrode 113d and the second outer electrode 114d may each have a second thickness ranging from 10 Angstroms to 1000 Angstroms. In some embodiments, the first inner dielectric layer 113a and the second inner dielectric layer 114a may each have a third thickness ranging from 5 Angstroms to 500 Angstroms. In some embodiments, the first capacitor dielectric 113c and the second capacitor dielectric 114c may each have a fourth thickness ranging from 5 Angstroms to 500 Angstroms.

The semiconductor substrate 102 may be or otherwise comprise, for example, a bulk silicon substrate, a bulk germanium substrate, a group III-V substrate, or some other suitable semiconductor substrate. The first inner electrode 113b, the first outer electrode 113d, the second inner electrode 114b, and the second outer electrode 114d may be or otherwise comprise, for example, doped polysilicon, metal, or some other suitable conductive material(s). The first inner dielectric layer 113a, the second inner dielectric layer 114a, and the first insulating layer 108 may be or otherwise comprise, for example, silicon dioxide, silicon nitride, some other suitable low-k dielectric(s), or any combination of the foregoing. The first capacitor dielectric 113c and the second capacitor dielectric 114c may be or otherwise comprise, for example, hafnium silicate, zirconium dioxide, hafnium dioxide, some other suitable high-k dielectric(s), or any combination of the foregoing.

An inter-layer dielectric (ILD) 106 is disposed over the DTC structure 105 and the semiconductor substrate 102. In some embodiments, a first encapsulation layer 107a is disposed directly over the ILD 106, and a second encapsulation layer 107b is disposed over the first encapsulation layer 107a. A metal interconnect structure 103 is stacked above the semiconductor substrate 102 such that it directly contacts a top surface of the DTC structure 105 and serves as a redistribution layer. A through-substrate via (TSV) 104 electrically couples the metal interconnect structure 101 to the metal interconnect structure 103, such that the TSV 104 extends vertically past opposing surfaces of the semiconductor substrate 102. The second encapsulation layer 107b seals a top surface of the TSV 104, preventing exposure of the TSV 104. In some embodiments, the first encapsulation layer 107a contacts outer sidewalls of the TSV 104, preventing exposure of the TSV 104. In some embodiments, the top surface of the TSV 104 is above a bottom surface of the first encapsulation layer 107a. Isolation structures 112a and 112b directly contact opposing outer sidewalls of the TSV 104 and laterally separate the TSV 104 from the semiconductor substrate 102. The metal interconnect structure 101 is directly coupled to the first DTC stack 113, and the metal interconnect structure 103 is directly coupled to the second DTC stack 114 by connecting vias 116. In some embodiments, a second insulating layer 110 comprises a metal interconnect structure 109 and separates the first insulating layer 108 from the die 111. In some embodiments, a third insulating layer 115 is disposed directly over the second encapsulation layer 107b. In some embodiments, the DTC structure 105 has a thickness ranging from 1 um to 500 um.

The metal interconnect structure 101, the metal interconnect structure 103, the metal interconnect structure 109, connecting vias 116, and the TSV 104 are conductive and may be or otherwise comprise, for example, tungsten, aluminum copper, copper, aluminum, some other suitable metal(s), or some other suitable conductive material(s). The ILD 106, the first encapsulation layer 107a, the second encapsulation layer 107b the second insulating layer 110, and the third insulating layer 115 may be or otherwise comprise, for example, silicon dioxide, silicon nitride, silicon carbide, some other suitable dielectric(s), or any combination of the foregoing. The isolation structures 112a and 112b may be or otherwise comprise, for example, undoped silicate glass, phosphosilicate glass, borophosophosilicate glass, some other suitable dielectric(s), or any combination of the foregoing.

The methodology behind the formation of previous DTC structures is complex and expensive. In order to have an optimized capacitance, the DTC structure may be vertically stacked. To vertically stack the DTC structure, the methodology may require the DTC structure to be greater than 600 um away from a die. The greater the distance between the die and the DTC structure, the greater the equivalent series resistance of the IC, causing a voltage of the IC to be more unstable. FIG. 1 illustrates a DTC structure 105 formed with a single semiconductor substrate 102. Compared to previous DTC structures that are stacked on two different substrates and which may be such more than 600 um away from a die, the DTC structure 105 is cheaper and simpler. Further, the DTC structure 105 may be less than 30 um away from the die 111, reducing equivalent series resistance and therefore increasing voltage stability of the IC.

Figure 2:
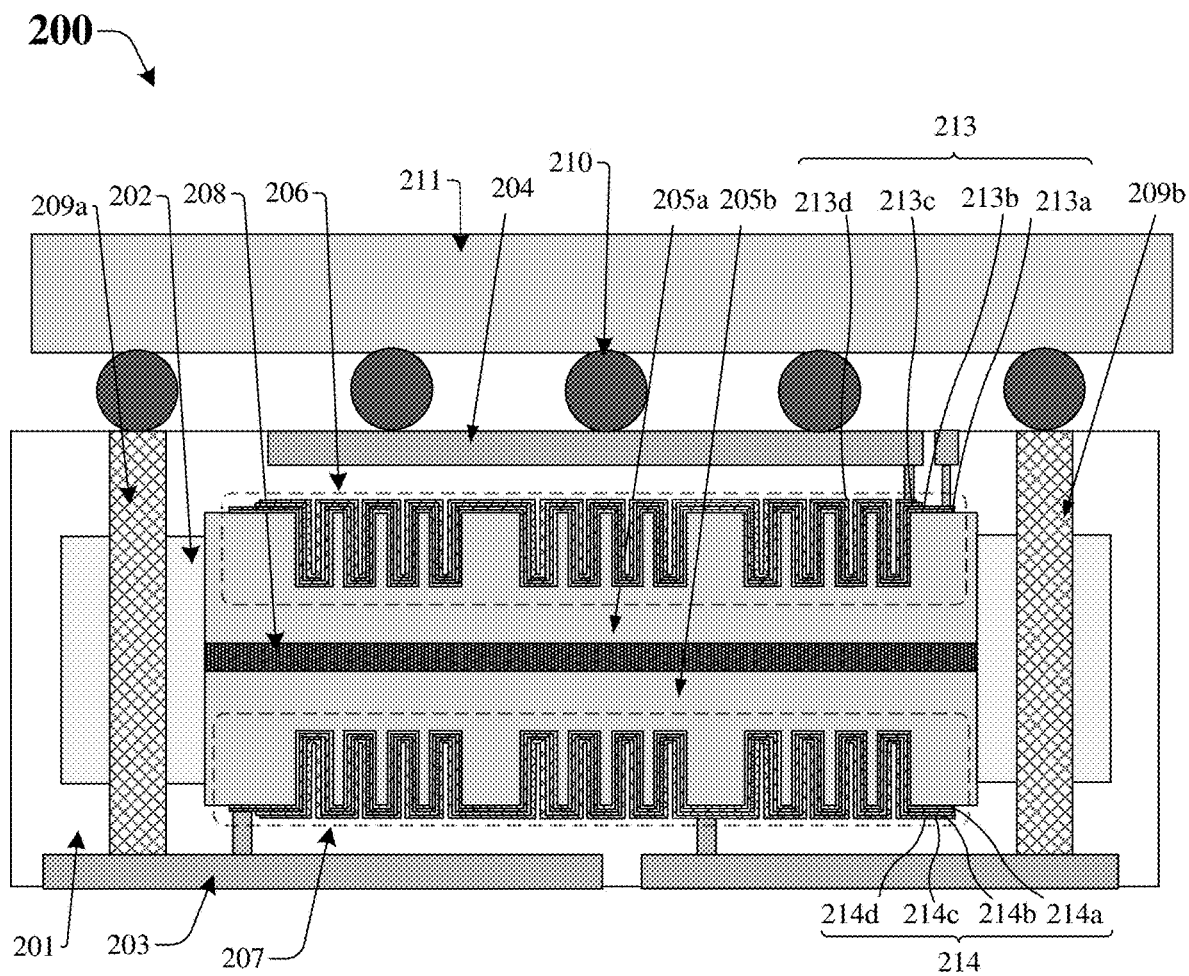
FIGS. 2 and 3 illustrate cross-sectional views of some additional embodiments of an IC comprising a stacked deep trench capacitor structure using a plurality of substrates.

FIG. 2 illustrates a cross sectional view 200 of some embodiments of an IC comprising a stacked deep trench capacitor structure. The IC comprises a package substrate 202 surrounded by a first insulating structure 201. A first semiconductor substrate 205a is disposed laterally between inner sidewalls of the package substrate 202. The first semiconductor substrate 205a comprises a first plurality of trenches 206 extending from an upper surface of the first semiconductor substrate 205a. Each trench of the first plurality of trenches 206 comprises a first DTC stack 213 configured to provide the IC with a capacitance, the first DTC stack 213 comprising a first inner dielectric layer 213a directly contacting the first semiconductor substrate 205a, a first inner electrode 213b, a first capacitor dielectric 213c, and a first outer electrode 213d. The first capacitor dielectric 213c separates the first inner electrode 213b from the first outer electrode 213d, and the first inner dielectric layer 213a separates the first inner electrode 213b from the first semiconductor substrate 205a. A second semiconductor substrate 205b is disposed laterally between inner sidewalls of the package substrate 202 and directly below the first semiconductor substrate 205a. The second semiconductor substrate 205b comprises a second plurality of trenches 207 extending from a lower surface of the second semiconductor substrate 205b. Each trench of the second plurality of trenches 207 comprises a second DTC stack 214 configured to provide the IC with a capacitance, the second DTC stack 214 comprising a second inner dielectric layer 214a directly contacting the second semiconductor substrate 205b, a second inner electrode 214b, a second capacitor dielectric 214c, and a second outer electrode 214d. The second capacitor dielectric 214c separates the second inner electrode 214b from the second outer electrode 214d, and the second inner dielectric layer 214a separates the second inner electrode 214b from the second semiconductor substrate 205b. In some embodiments, a lower surface of the first semiconductor substrate 205a is bonded to the upper surface of the second semiconductor substrate 205b by a bonding layer 208.

The first semiconductor substrate 205a and the second semiconductor substrate 205b may be or otherwise comprise, for example, a bulk silicon substrate, a bulk germanium substrate, a group III-V substrate, or some other suitable semiconductor substrate. The first inner electrode 213b, the first outer electrode 213d, the second inner electrode 214b, and the second outer electrode 214d may be or otherwise comprise, for example, doped polysilicon, metal, or some other suitable conductive material(s). The first inner dielectric layer 213a, the second inner dielectric layer 214a, and the first insulating structure 201 may be or otherwise comprise, for example, silicon dioxide, silicon nitride, some other suitable low-k dielectric(s), or any combination of the foregoing. The first capacitor dielectric 213c and the second capacitor dielectric 214c may be or otherwise comprise, for example, hafnium silicate, zirconium dioxide, hafnium dioxide, some other suitable high-k dielectric(s), or any combination of the foregoing. The package substrate 202 may be or otherwise comprise, for example, ceramic, epoxy, or another suitable packaging material. The bonding layer 208 may be or otherwise comprise, for example, an epoxy-based negative photoresist, benzocyclobutene (BCB), or another suitable adhesive.

The first insulating structure 201 comprises a metal interconnect structure 203 electrically coupled to the first DTC stack 213. In some embodiments, the metal interconnect structure 203 is entirely below the package substrate 202. The first insulating structure 201 further comprises a metal interconnect structure 204 serving as a redistribution layer electrically coupled to the second DTC stack 214. In some embodiments, the metal interconnect structure 204 is entirely above the package substrate 202. A plurality of solder balls 210 electrically couple the metal interconnect structure 204 to a die 211. TSV 209a and TSV 209b extend through the package substrate 202 and electrically couple the metal interconnect structure 203 to the solder balls 210. The metal interconnect structure 203 is directly coupled to the second DTC stack 214, and the metal interconnect structure 204 is directly coupled to the second DTC stack 214.

The metal interconnect structure 203, the metal interconnect structure 204, the TSV 209a, the TSV 209b, and the solder balls 210 are conductive and may be or otherwise comprise, for example, tungsten, aluminum copper, copper, aluminum, some other suitable metal(s), or some other suitable conductive material(s).

Figure 3:
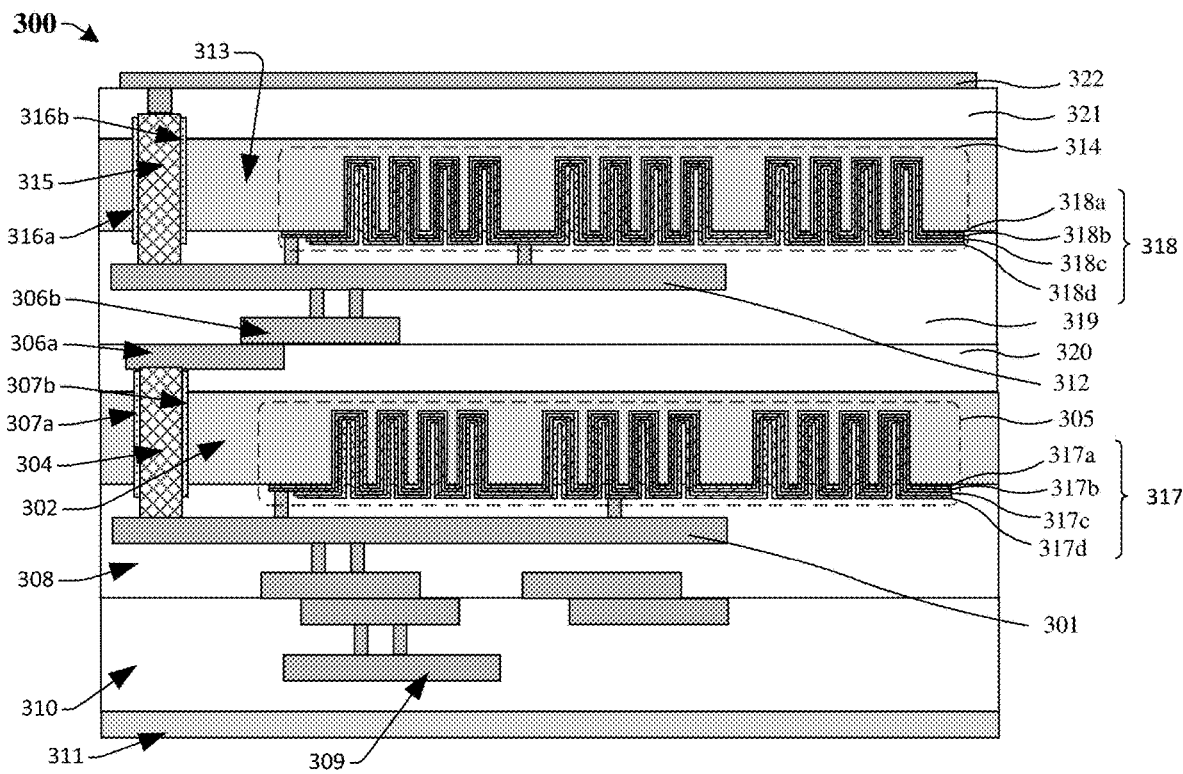

FIG. 3 illustrates a cross sectional view 300 of some embodiments of an IC comprising a stacked deep trench capacitor structure. The IC comprises a first insulating layer 308 comprising a metal interconnect structure 301 stacked above a die 311. A first semiconductor substrate 302 is disposed above the first insulating layer 308. The first semiconductor substrate 302 comprises a first plurality of trenches 305 extending from a lower surface of the first semiconductor substrate 302. Each trench of the first plurality of trenches 305 comprises a first DTC stack 317 configured to provide the IC with a capacitance, the first DTC stack 317 comprising a first inner dielectric layer 317a directly contacting the first semiconductor substrate 302, a first inner electrode 317b, a first capacitor dielectric 317c, and a first outer electrode 317d. The first capacitor dielectric 317c separates the first inner electrode 317b from the first outer electrode 317d, and the first inner dielectric layer 317a separates the first inner electrode 317b from the first semiconductor substrate 302. A first inter-layer dielectric (ILD) 320 is disposed over the first semiconductor substrate 302 and comprises a first redistribution layer 306a. A first through-substrate via (TSV) 304 electrically couples the metal interconnect structure 301 to the first redistribution layer 306a, such that the first TSV 304 extends vertically past opposing surfaces of the first semiconductor substrate 302. A first pair of isolation structures 307a and 307b directly contact opposing outer sidewalls of the first TSV 304 and laterally separate the first TSV 304 from the first semiconductor substrate 302.

A second insulating layer 319 is disposed directly above the first ILD 320 and comprises a second redistribution layer 306b electrically coupled to the first redistribution layer 306a. The second insulating layer 319 further comprises a metal interconnect structure 312 electrically coupled to the second redistribution layer 306b. A second semiconductor substrate 313 is disposed above the second insulating layer 319. The second semiconductor substrate 313 comprises a second plurality of trenches 314 extending from a lower surface of the second semiconductor substrate 313. Each trench of the second plurality of trenches 314 comprises a second DTC stack 318 configured to provide the IC with a capacitance, the second DTC stack 318 comprising a second inner dielectric layer 318a directly contacting the second semiconductor substrate 313, a second inner electrode 318b, a second capacitor dielectric 318c, and a second outer electrode 318d. The second capacitor dielectric 318c separates the second inner electrode 318b from the second outer electrode 318d, and the second inner dielectric layer 318a separates the second inner electrode 318b from the second semiconductor substrate 313. A second inter-layer dielectric (ILD) 321 is disposed over the second semiconductor substrate 313 and comprises a metal interconnect structure 322 that serves as a redistribution layer. A second TSV 315 electrically couples the metal interconnect structure 312 to the metal interconnect structure 322, such that the second TSV 315 extends vertically past opposing surfaces of the second semiconductor substrate 313. A second pair of isolation structures 316a and 316b directly contact opposing outer sidewalls of the second TSV 315 and laterally separate the second TSV 315 from the second semiconductor substrate 313. The metal interconnect structure 301 is directly coupled to the first DTC stack 317, and the metal interconnect structure 312 is directly coupled to the second DTC stack 318. In some embodiments, a third insulating layer 310 comprising a metal interconnect structure 309 separates the first insulating layer 308 from the die 311.

The first semiconductor substrate 302 and the second semiconductor substrate 313 may be or otherwise comprise, for example, a bulk silicon substrate, a bulk germanium substrate, a group III-V substrate, or some other suitable semiconductor substrate. The first inner electrode 317b, the first outer electrode 317d, the second inner electrode 318b, and the second outer electrode 318d may be or otherwise comprise, for example, doped polysilicon, metal, or some other suitable conductive material(s). The first inner dielectric layer 317a, the second inner dielectric layer 318a, the second insulating layer 319, the third insulating layer 310, the first ILD 320, the second ILD 321, and the first insulating layer 308 may be or otherwise comprise, for example, silicon dioxide, silicon nitride, some other suitable low-k dielectric(s), or any combination of the foregoing. The first capacitor dielectric 317c and the second capacitor dielectric 318c may be or otherwise comprise, for example, hafnium silicate, zirconium dioxide, hafnium dioxide, some other suitable high-k dielectric(s), or any combination of the foregoing. The metal interconnect structure 301, the metal interconnect structure 312, the metal interconnect structure 322, the first TSV 304, the second TSV 315, the first redistribution layer 306a, and the second redistribution layer 306b are conductive and may be or otherwise comprise, for example, tungsten, aluminum copper, copper, aluminum, some other suitable metal(s), or some other suitable conductive material(s). The first pair of isolation structures 307a and 307b and the second pair of isolation structures 316a and 316b may be or otherwise comprise, for example, an oxide (e.g. silicon dioxide), some other suitable dielectric(s), or any combination of the foregoing.

Figure 4:
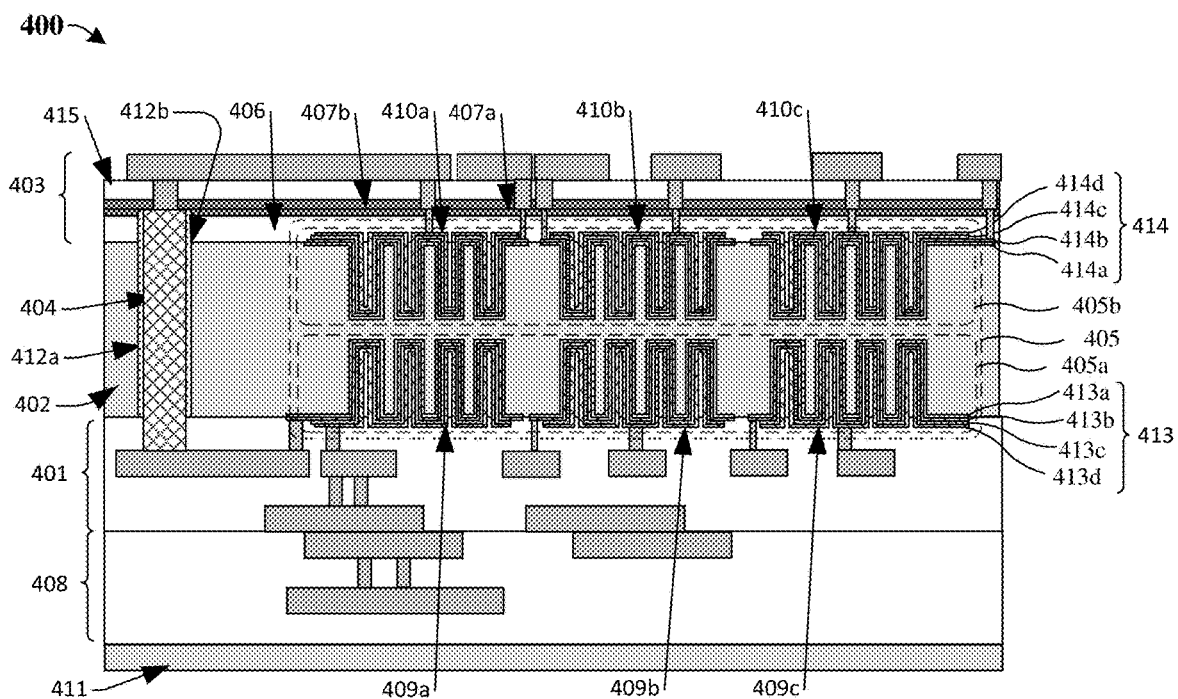
FIG. 4 illustrates a cross-sectional view of some additional embodiments of an IC comprising a stacked deep trench capacitor structure in a single substrate.

FIG. 4 illustrates a cross sectional view 400 of some embodiments of an IC comprising a stacked deep trench capacitor structure. The IC comprises a metal interconnect layer 401 stacked above a die 411. A semiconductor substrate 402 is disposed above the metal interconnect layer 401. The semiconductor substrate 402 comprises a DTC structure 405 comprising a first plurality of trenches 405a extending from a first side of the semiconductor substrate 402 and a second plurality of trenches 405b extending from a second side of the semiconductor substrate 402. The first plurality of trenches 405a are separated into one or more lower groups (e.g. first lower group 409a, second lower group 409b, and third lower group 409c) of one or more trenches, and the second plurality of trenches 405b are separated into one or more upper groups (e.g. first upper group 410a, second upper group 410b, and third upper group 410c) of one or more trenches. Each lower group (e.g. first lower group 409a, second lower group 409b, and third lower group 409c) of the first plurality of trenches 405a comprises a first DTC stack 413 configured to provide the IC with a capacitance, the first DTC stack 413 comprising a first inner dielectric layer 413a directly contacting the semiconductor substrate 402, a first inner electrode 413b, a first capacitor dielectric 413c, and a first outer electrode 413d. The first capacitor dielectric 413c separates the first inner electrode 413b from the first outer electrode 413d, and the first inner dielectric layer 413a separates the first inner electrode 413b from the semiconductor substrate 402. The first DTC stack 413 of each lower group (e.g. first lower group 409a, second lower group 409b, and third lower group 409c) of the first plurality of trenches 405a is laterally and electrically isolated from the first DTC stack 413 of each other lower group, such that each lower group can represent a separate capacitor structure. Each upper group (e.g. first upper group 410a, second upper group 410b, and third upper group 410c) of the second plurality of trenches 405b comprises a second DTC stack 414 configured to provide the IC with a capacitance, the second DTC stack 414 comprising a second inner dielectric layer 414a directly contacting the semiconductor substrate 402, a second inner electrode 414b, a second capacitor dielectric 414c, and a second outer electrode 414d. The second capacitor dielectric 414c separates the second inner electrode 414b from the second outer electrode 414d, and the second inner dielectric layer 414a separates the second inner electrode 414b from the semiconductor substrate 402. The second DTC stack 414 of each upper group (e.g. first upper group 410a, second upper group 410b, and third upper group 410c) of the second plurality of trenches 405b is laterally and electrically isolated from the second DTC stack 414 of each other upper group, such that each upper group can represent a separate capacitor structure. In some embodiments, the DTC structure 405 may be less than 30 um away from the die 411. In some embodiments, the DTC stack 413 and the DTC stack 414 may comprise additional metal layers and additional insulating layers, such that an insulating layer separates each metal layer. In some embodiments, the first inner electrode 413b and the second inner electrode 414b may each have a first thickness ranging from 10 Angstroms to 1000 Angstroms. In some embodiments, the first outer electrode 113d and the second outer electrode 414d may each have a second thickness ranging from 10 Angstroms to 1000 Angstroms. In some embodiments, the first inner dielectric layer 413a and the second inner dielectric layer 414a may each have a third thickness ranging from 5 Angstroms to 500 Angstroms. In some embodiments, the first capacitor dielectric 413c and the second capacitor dielectric 414c may each have a fourth thickness ranging from 5 Angstroms to 500 Angstroms.

The semiconductor substrate 402 may be or otherwise comprise, for example, a bulk silicon substrate, a bulk germanium substrate, a group III-V substrate, or some other suitable semiconductor substrate. The first inner electrode 413b, the first outer electrode 413d, the second inner electrode 414b, and the second outer electrode 414d may be or otherwise comprise, for example, doped polysilicon, metal, or some other suitable conductive material(s). The first inner dielectric layer 413a and the second inner dielectric layer 414a may be or otherwise comprise, for example, silicon dioxide, silicon nitride, some other suitable low-k dielectric(s), or any combination of the foregoing. The first capacitor dielectric 413c and the second capacitor dielectric 414c may be or otherwise comprise, for example, hafnium silicate, zirconium dioxide, hafnium dioxide, some other suitable high-k dielectric(s), or any combination of the foregoing.

A metal interconnect layer 403 is stacked above the semiconductor substrate 402 such that it directly contacts a top surface of the DTC structure 405 and serves as a redistribution layer. The metal interconnect layer 403 comprises an inter-layer dielectric (ILD) 406 disposed over the DTC structure 405 and the semiconductor substrate 402. In some embodiments, a first encapsulation layer 407a is disposed directly over the ILD 406. In further embodiments, a second encapsulation layer 407b is disposed directly over the first encapsulation layer 407a. A through-substrate via (TSV) 404 electrically couples the metal interconnect layer 403 to the metal interconnect layer 401, such that the TSV 404 extends vertically past opposing surfaces of the semiconductor substrate 402. The second encapsulation layer 407b encapsulates a top surface of the TSV 404. The first encapsulation layer 407a lines outer sidewalls of the TSV 404. In some embodiments, the top surface of the TSV 404 is above a bottom surface of the first encapsulation layer 407a. Isolation structures 412a and 412b directly contact opposing outer sidewalls of the TSV 404 and laterally separate the TSV 404 from the semiconductor substrate 402. The metal interconnect layer 401 is directly coupled to the first DTC stack 413, and the metal interconnect layer 403 is directly coupled to the second DTC stack 414. In some embodiments, a metal interconnect layer 408 separates the metal interconnect layer 401 from the die 411. In some embodiments, an insulating layer 415 is disposed directly over the second encapsulation layer 407*b*. In some embodiments, the DTC structure 405 has a thickness ranging from 1 um to 500 um.

The metal interconnect layer 403, the metal interconnect layer 401, the metal interconnect layer 408, and the TSV 404 are conductive and may be or otherwise comprise, for example, tungsten, aluminum copper, copper, aluminum, some other suitable metal(s), or some other suitable conductive material(s). The ILD 406, the first encapsulation layer 407*a*, the second encapsulation layer 407*b*, and the insulating layer 415 may be or otherwise comprise, for example, silicon dioxide, silicon nitride, some other suitable low-k dielectric(s), or any combination of the foregoing. The isolation structures 412*a* and 412*b* may be or otherwise comprise, for example, undoped silicate glass, phosphosilicate glass, borophosophosilicate glass, some other suitable dielectric(s), or any combination of the foregoing.

The methodology behind the formation of previous DTC structures is complex and expensive. In order to have an optimized capacitance, the DTC structure may be vertically stacked. To vertically stack the DTC structure, the methodology may require the DTC structure to be greater than 600 um away from a die. The greater the distance between the die and the DTC structure, the greater the equivalent series resistance of the IC, causing a voltage of the IC to be more unstable. FIG. 4 illustrates a DTC structure 405 formed with a single semiconductor substrate 402, such that forming the DTC structure 405 is cheaper and simpler than the existing methodology. Further, the DTC structure 405 may be less than 30 um away from the die 411, reducing equivalent series resistance and therefore increasing voltage stability of the IC.

Figure 5:
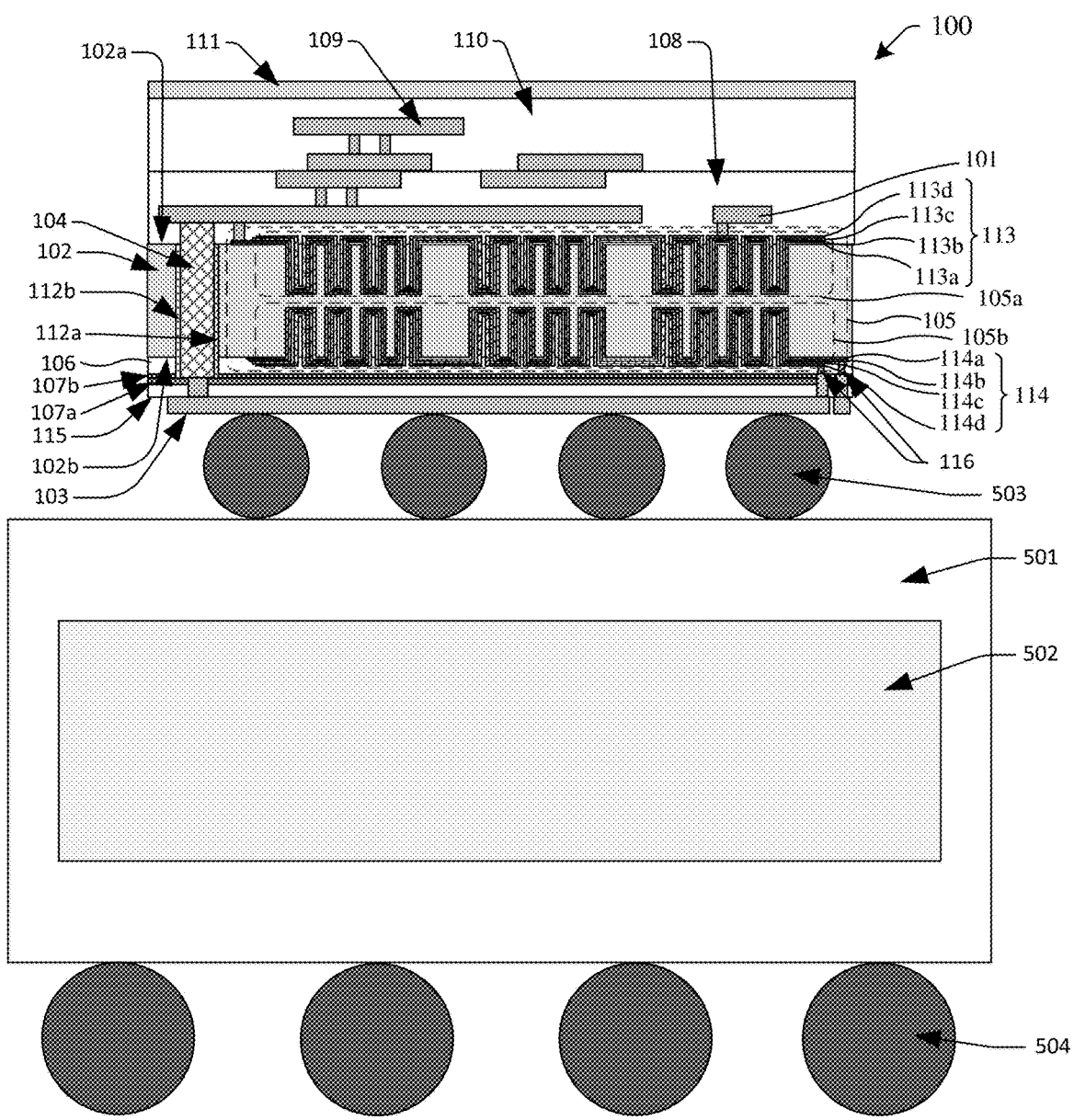
FIG. 5 illustrates a cross-sectional view of some additional embodiments of an IC comprising a stacked deep trench capacitor structure in a single substrate.

FIG. 5 illustrates a cross-sectional view 500 of some embodiments of an IC comprising a stacked deep trench capacitor structure embedded with a logic chip and coupled to a package substrate. The IC may comprise, for example, the IC of FIG. 1, illustrated by cross-sectional view 100. The IC comprises a first insulating layer 108 comprising a metal interconnect structure 101 stacked on a backside of a die 111. A semiconductor substrate 102 is disposed along a backside of the first insulating layer 108. The semiconductor substrate 102 comprises a DTC structure 105 comprising a first plurality of trenches 105*a* extending from a first side of the semiconductor substrate 102 and a second plurality of trenches 105*b* extending from a second side of the semiconductor substrate 102. Each trench of the first plurality of trenches 105*a* comprises a first DTC stack 113 configured to provide the IC with a capacitance, the first DTC stack 113 comprising a first inner dielectric layer 113*a* directly contacting the semiconductor substrate 102, a first inner electrode 113*b*, a first capacitor dielectric 113*c*, and a first outer electrode 113*d*. The first capacitor dielectric 113*c* separates the first inner electrode 113*b* from the first outer electrode 113*d*, and the first inner dielectric layer 113*a* separates the first inner electrode 113*b* from the semiconductor substrate 102. Each trench of the second plurality of trenches 105*b* comprises a second DTC stack 114 configured to provide the IC with a capacitance, the second DTC stack 114 comprising a second inner dielectric layer 114*a* directly contacting the semiconductor substrate 102, a second inner electrode 114*b* a second capacitor dielectric 114*c*, and a second outer electrode 114*d*. The second capacitor dielectric 114*c* separates the second inner electrode 114*b* from the second outer electrode 114*d*, and the second inner dielectric layer 114*a* separates the second inner electrode 114*b* from the semiconductor substrate 102. In some embodiments, the first DTC stack 113 and the second DTC stack 114 may comprise additional metal layers and additional insulating layers, such that an insulating layer separates each metal layer.

An inter-layer dielectric (ILD) 106 is disposed along a backside of the DTC structure 105 and the semiconductor substrate 102. In some embodiments, a first encapsulation layer 107*a* is disposed directly along a backside of the ILD 106, and a second encapsulation layer 107*b* is disposed along a backside of the first encapsulation layer 107*a*. A metal interconnect structure 103 is disposed along a backside the semiconductor substrate 102 such that it directly contacts a backside surface of the DTC structure 105. A through-substrate via (TSV) 104 electrically couples the metal interconnect structure 101 to the metal interconnect structure 103, such that the TSV 104 extends vertically past opposing surfaces of the semiconductor substrate 102. The second encapsulation layer 107*b* seals a backside surface of the TSV 104, preventing exposure of the TSV 104. An insulating structure 501 surrounds a package substrate 502, and solder balls 503 couple a backside of the metal interconnect structure 103 to a frontside of the insulating structure 501. In some embodiments, a ball-grid array 504 is disposed along a backside of the insulating structure 501 to provide an electrical connection to an external device. In some embodiments, the first encapsulation layer 107*a* contacts outer sidewalls of the TSV 104, preventing exposure of the TSV 104. In some embodiments, the top surface of the TSV 104 is above a bottom surface of the first encapsulation layer 107*a*. Isolation structures 112*a* and 112*b* directly contact opposing outer sidewalls of the TSV 104 and laterally separate the TSV 104 from the semiconductor substrate 102. The metal interconnect structure 101 is directly coupled to the first DTC stack 113, and the metal interconnect structure 103 is directly coupled to the second DTC stack 114 by connecting vias 116. In some embodiments, a second insulating layer 110 comprises a metal interconnect structure 109 and separates the first insulating layer 108 from the die 111. In some embodiments, a third insulating layer 115 is disposed directly over the second encapsulation layer 107*b*. In some embodiments, the DTC structure 105 has a thickness ranging from 1 um to 500 um.

The ball-grid array 504 and the solder balls 503 are conductive and may be or otherwise comprise, for example, tungsten, aluminum copper, copper, aluminum, some other suitable metal(s), or some other suitable conductive material(s). The package substrate 502 may be or otherwise comprise, for example, ceramic, epoxy, or another suitable packaging material. The insulating structure 501 may be or otherwise comprise, for example, silicon dioxide, silicon nitride, some other suitable low-k dielectric(s), or any combination of the foregoing.

The methodology behind the formation of previous DTC structures is complex and expensive. In order to have an optimized capacitance, the DTC structure may be vertically stacked. To vertically stack the DTC structure, the methodology may require the DTC structure to be greater than 600 um away from a die. The greater the distance between the die and the DTC structure, the greater the equivalent series resistance of the IC, causing a voltage of the IC to be more unstable. FIG. 5 illustrates a DTC structure 105 that may be less than 30 um away from the die 111, reducing equivalent series resistance and therefore increasing voltage stability of the IC.

With reference to FIGS. 6A-6L, a series of cross sections 600A-600L illustrate some embodiments of a method for forming an IC comprising stacked deep trench capacitor structure. The IC may, for example, correspond to the IC of FIG. 1.

Figure 6A:
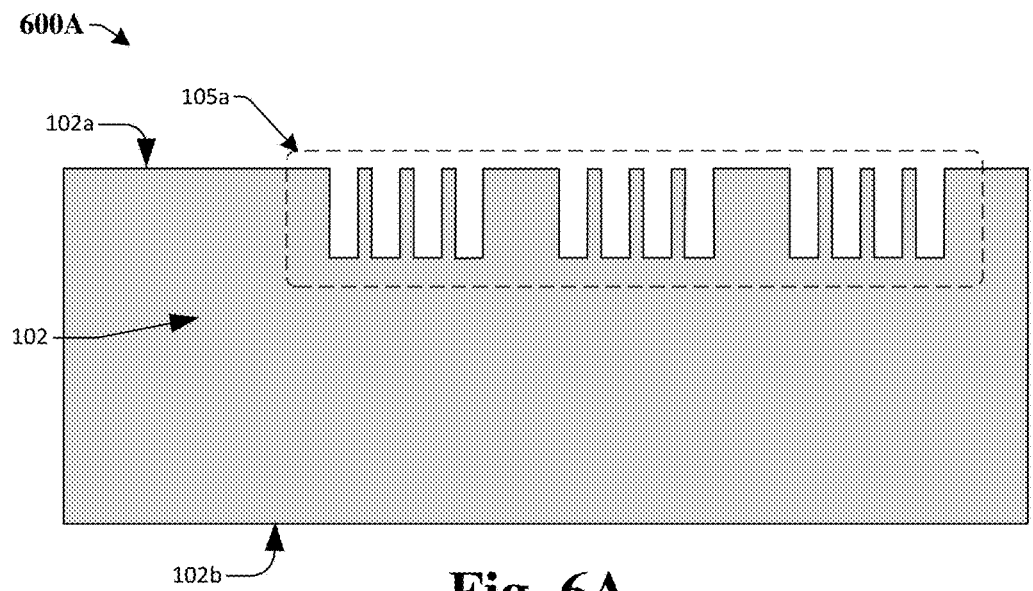
FIGS. 6A-6L illustrate a series of cross-sectional views for a method of forming an IC comprising a stacked deep trench capacitor structure in a single wafer.

As illustrated by the cross-sectional view 600A of FIG. 6A, a semiconductor substrate 102 is prepared including a first side 102a and a second side 102b. A hard mask is disposed over the first side 102a of the semiconductor substrate 102, and a first plurality of trenches 105a are etched into the first side 102a of the semiconductor substrate 102. A removal process then removes the remaining hard mask. The removal process may be or otherwise comprise, for example, a Si dry etch, an alkali wet etch, or some other suitable removal process. The semiconductor substrate 102 may be or otherwise comprise, for example, a bulk silicon substrate, a bulk germanium substrate, a group III-V substrate, or some other suitable semiconductor substrate.

Figure 6B:
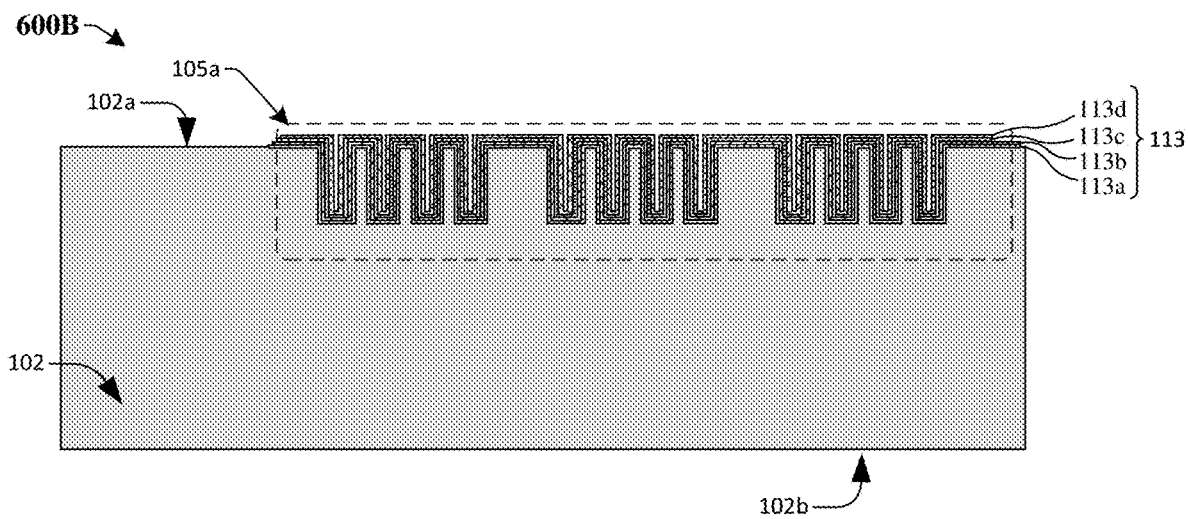

As illustrated by the cross-sectional view 600B of FIG. 6B, a first DTC stack 113 is formed within the first plurality of trenches 105a. Forming the first DTC stack 113 comprises forming a first inner dielectric layer 113a within the first plurality of trenches 105a and over the first side 102a of the semiconductor substrate 102. Then, a first inner electrode 113b is formed within the first plurality of trenches 105a and over the first inner dielectric layer 113a. In some embodiments, a lithography process etching process is then done on the first inner electrode 113b to laterally offset an outer edge of the first inner electrode 113b from an outer edge of the first inner dielectric layer 113a. Then, a first capacitor dielectric 113c is formed within the first plurality of trenches 105a and over the first inner electrode 113b. In some embodiments, an etching process is then done on the capacitor dielectric 113c to laterally offset an outer edge of the capacitor dielectric 113c from the outer edge of the first inner electrode 113b and the outer edge of the first inner dielectric layer 113a. Then, a first outer electrode 113d is formed within the first plurality of trenches 105a and over the first capacitor dielectric 11c. In some embodiments, an etching process is then done on the first outer electrode 113d to laterally offset an outer edge of the first outer electrode 113d from the outer edge of the capacitor dielectric 113c, the outer edge of the first inner electrode 113b, and the outer edge of the first inner dielectric layer 113a. The first DTC stack 113 may be formed by chemical vapor deposition, physical vapor deposition, electroplating, atomic-layer deposition, another suitable formation process, or any combination of the foregoing.

Figure 6C:
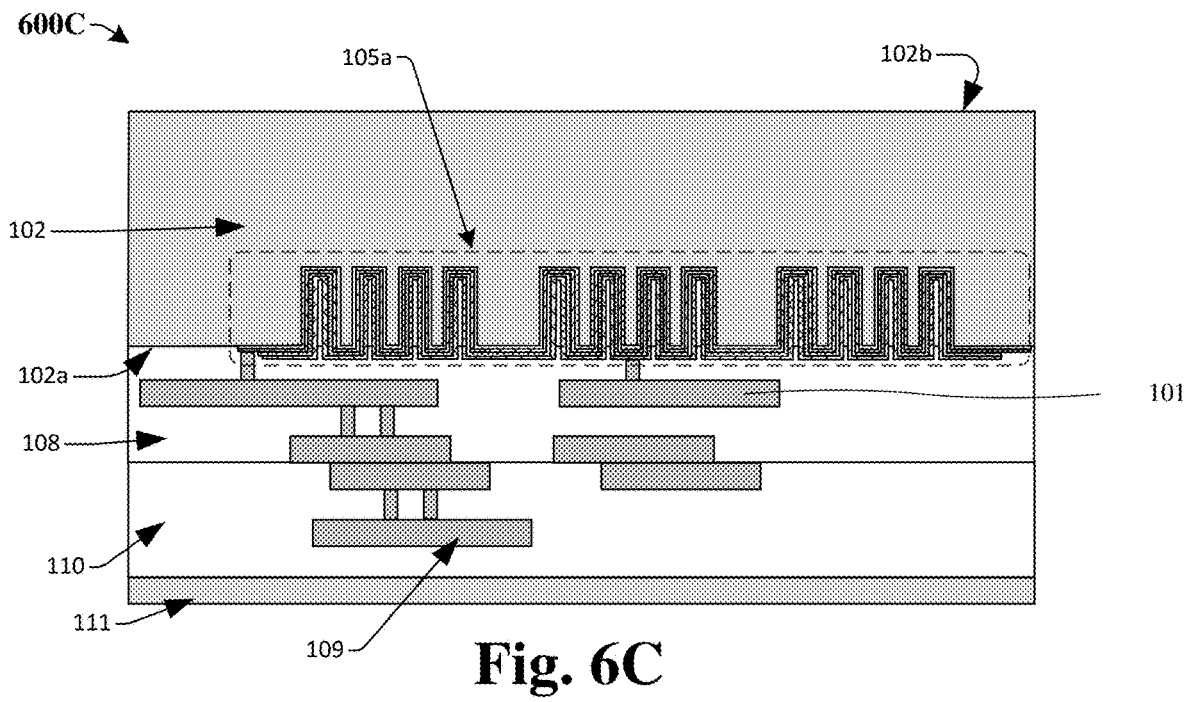

As illustrated by the cross-sectional view 600C of FIG. 6C, a metal interconnect structure 101 is formed within a first insulating layer 108 along the first side 102a of the semiconductor substrate 102 and is in contact with the first DTC stack 113. The metal interconnect structure 101 and the first insulating layer 108 may be formed by a lithography process. The second side 102b of the semiconductor substrate 102 then undergoes a thin down process. In some embodiments, a second insulating layer 110 comprising a metal interconnect structure 109 and stacked above a die 111 is bonded to the first insulating layer 108 by a bonding process, separating the die 111 from the first insulating layer 108. The bonding process may be or otherwise comprise a hybrid bond, a fusion bond, or some other suitable bonding process. The thin down process may be or otherwise comprise, for example, grinding, a Si dry etch, an alkali wet etch, a chemical-mechanical planarization process, some other suitable thin down process, or any combination of the foregoing.

Figure 6D:
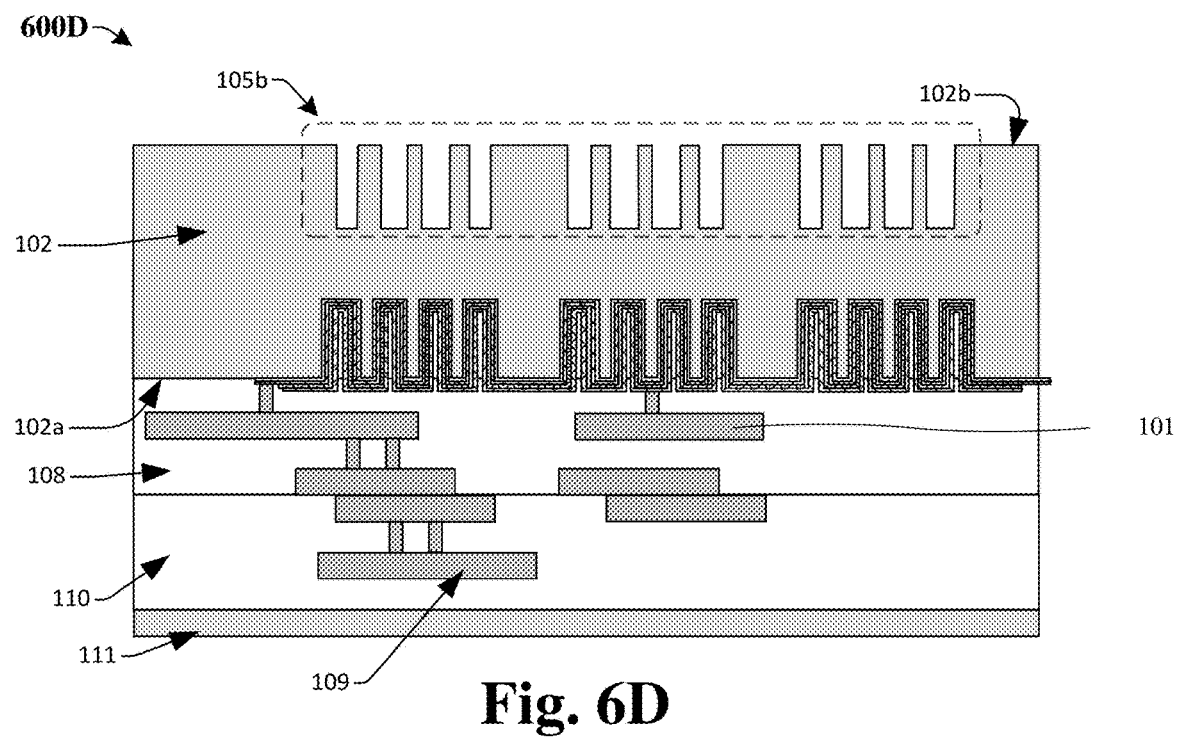

As illustrated by the cross-sectional view 600D of FIG. 6D, a hard mask is disposed over the second side 102b of the semiconductor substrate 102, and a second plurality of trenches 105b are etched into the second side 102b of the semiconductor substrate 102. A removal process then removes the remaining hard mask. The removal process may be or otherwise comprise, for example, a Si dry etch, an alkali wet etch, or some other suitable removal process.

Figure 6E:
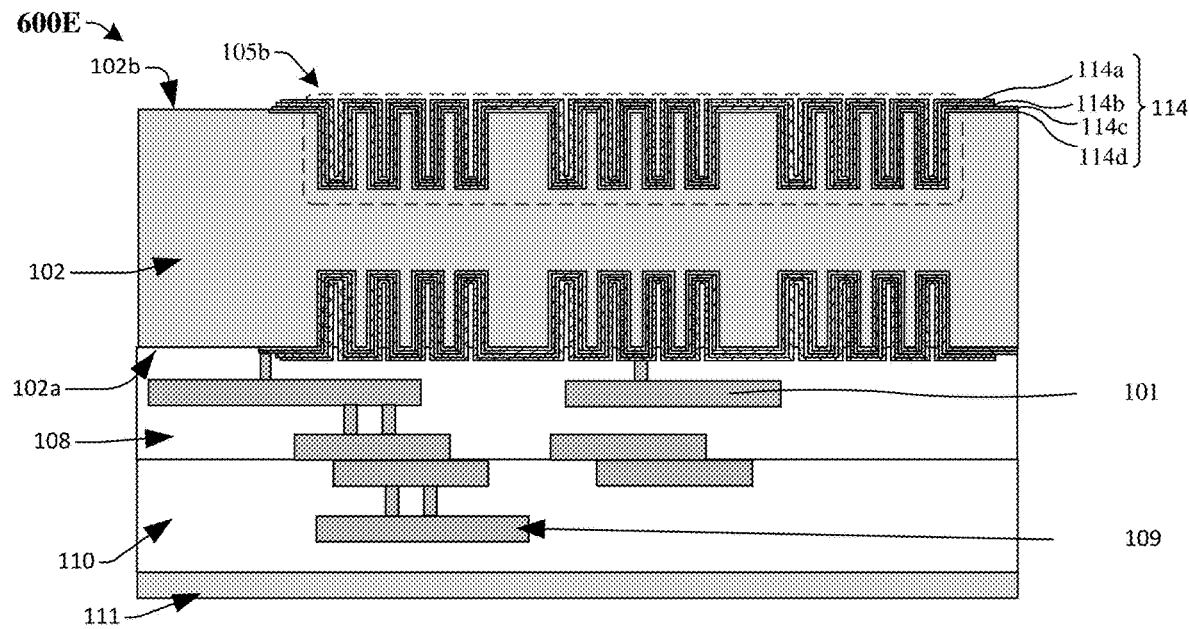

As illustrated by the cross-sectional view 600E of FIG. 6E, a second DTC stack 114 is formed within the second plurality of trenches 105b. Forming the second DTC stack 114 comprises forming a second inner dielectric layer 114a within the second plurality of trenches 105b and over the second side 102b of the semiconductor substrate 102. Then, a second inner electrode 114b is formed within the second plurality of trenches 105b and over the second inner dielectric layer 114a. Then, a second capacitor dielectric 114c is formed within the second plurality of trenches 105b and over the second inner electrode 114b. Then, a second outer electrode 114d is formed within the second plurality of trenches 105b and over the second capacitor dielectric 114c. The second DTC stack 114 may be formed by chemical vapor deposition, physical vapor deposition, electroplating, atomic-layer deposition, another suitable formation process, or any combination of the foregoing.

Figure 6F:
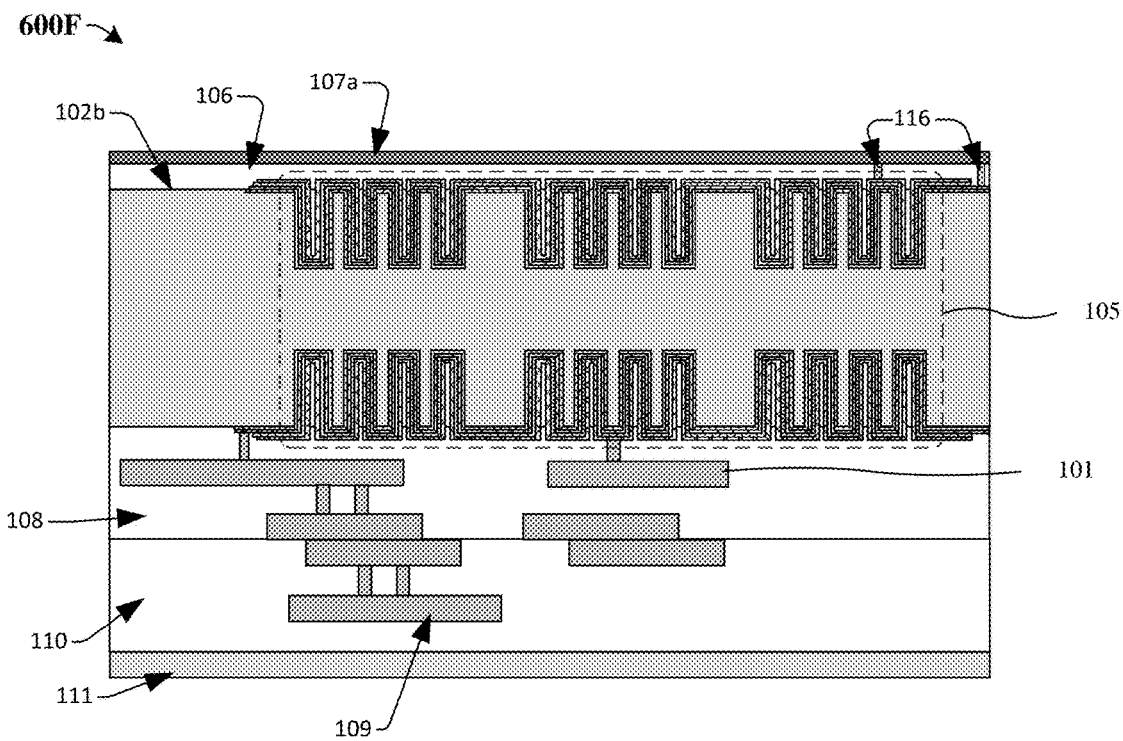

As illustrated by the cross-sectional view 600F of FIG. 6F, an inter-layer dielectric (ILD) 106 is formed over the second side 102b of the semiconductor substrate 102, and connecting vias 116 are formed within the ILD 106 and are coupled to the second DTC stack 114. A first encapsulation layer 107a is formed over the ILD 106.

Figure 6G:
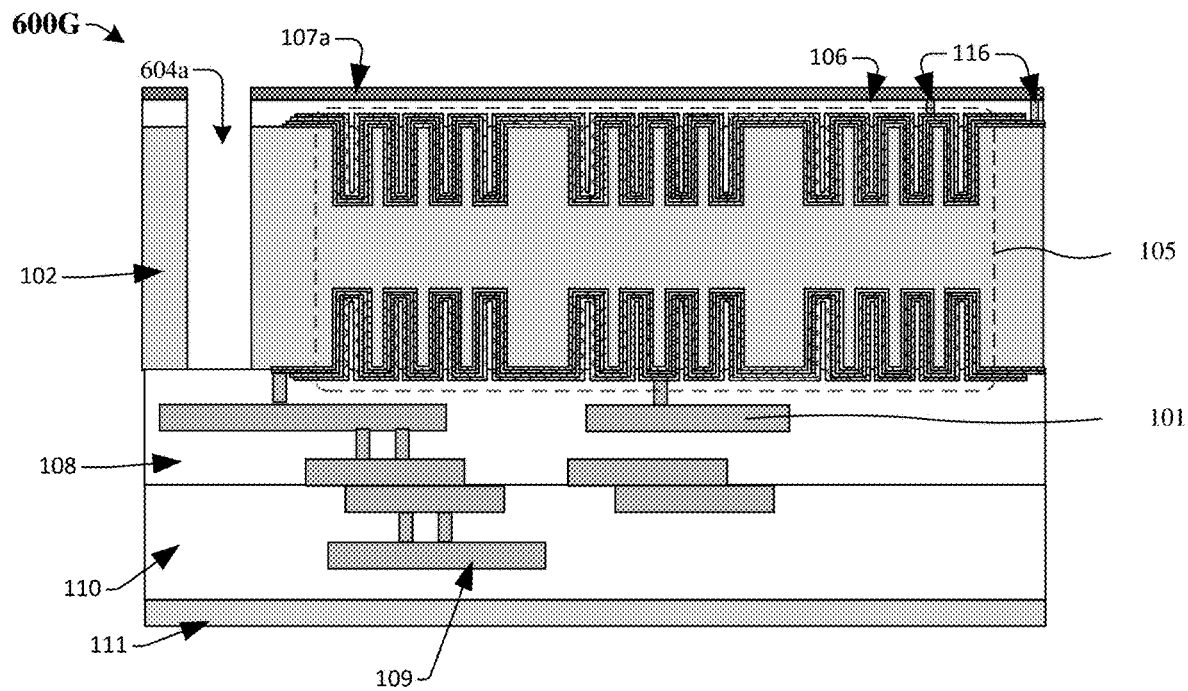

As illustrated by the cross-sectional view 600G of FIG. 6G, a hard mask is formed over a top surface of the first encapsulation layer 107a. A first trench 604a is etched into the first encapsulation layer 107a, ILD 106, and the semiconductor substrate 102. The first trench 604a extends from a top surface of the first encapsulation layer 107a to a top surface of the first insulating layer 108, such that a portion of the first insulating layer 108 is exposed. A removal process then removes the remaining hard mask. The removal process may be or otherwise comprise, for example, a Si dry etch, an alkali wet etch, or some other suitable removal process.

Figure 6H:
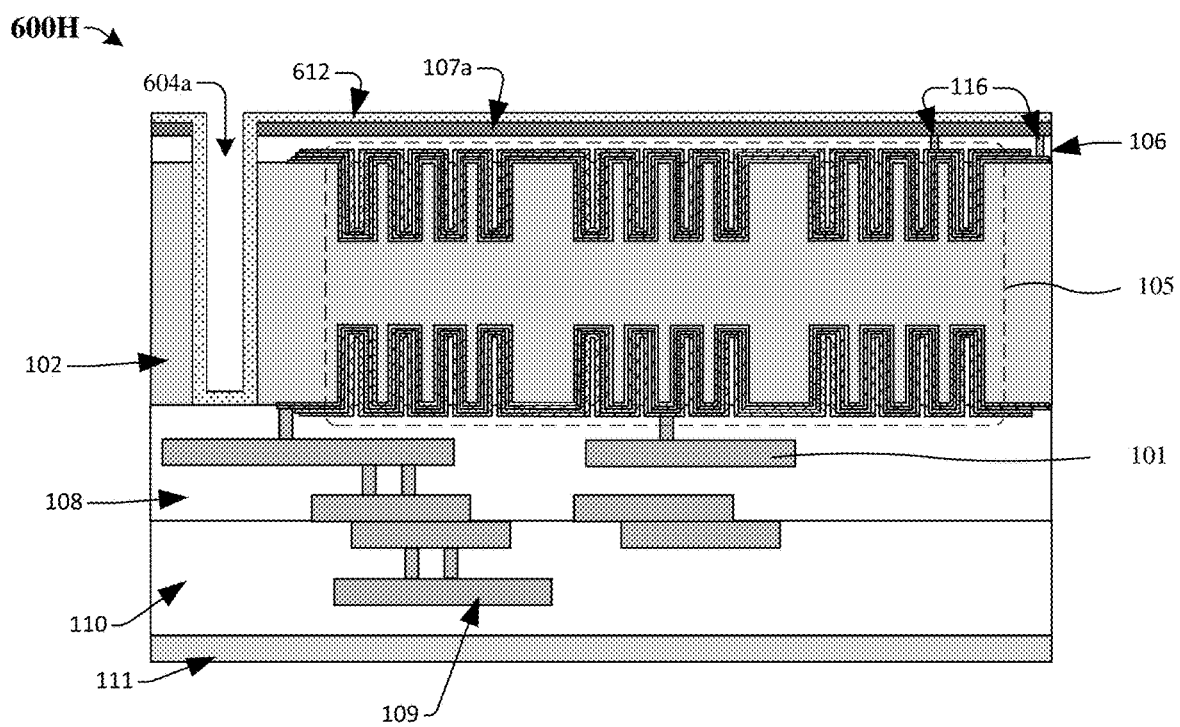

As illustrated by the cross-sectional view 600H of FIG. 6H, a dielectric layer 612 is formed over a top surface of the ILD 106 and within the first trench 604a such that the dielectric layer 612 is formed along inner sidewalls of the first encapsulation layer 107a along inner sidewalls of the ILD 106, along inner sidewalls of the semiconductor substrate 102, and over the exposed portion of the first insulating layer 108. The formation process for the dielectric layer 612 may be or otherwise comprise, for example, chemical vapor deposition, physical vapor deposition, sputtering, or some other suitable formation process. The dielectric layer 612 may be or otherwise comprise, for example, an oxide (e.g. silicon dioxide), some other suitable dielectric(s), or any combination of the foregoing.

Figure 6I:
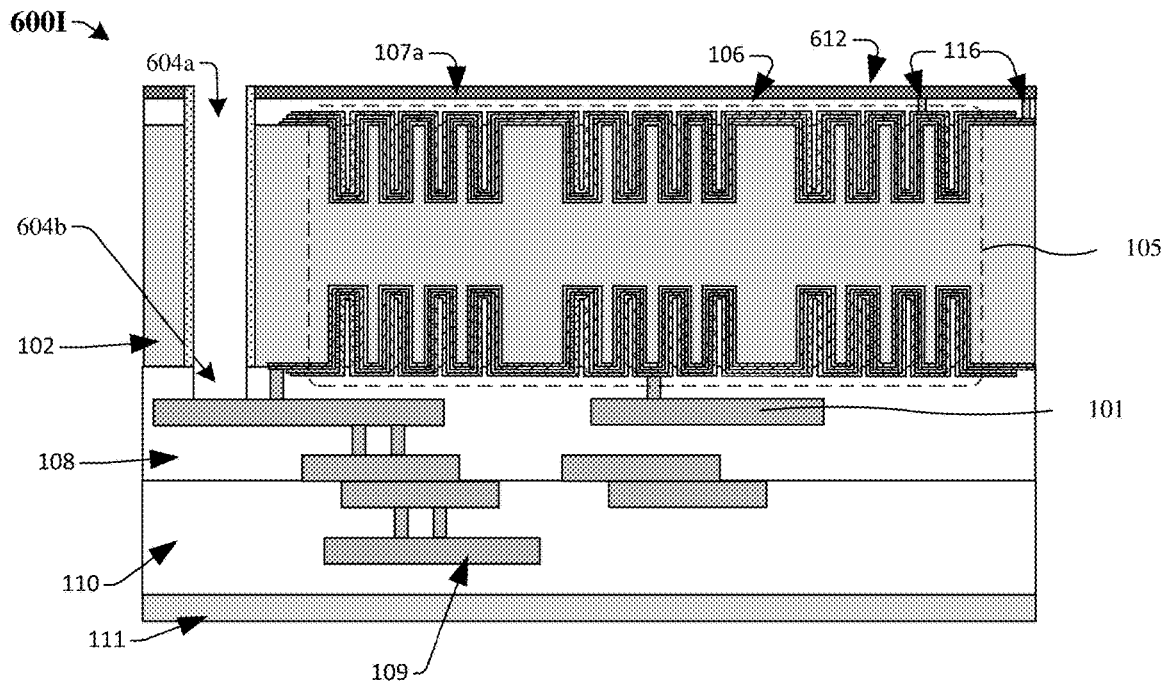

As illustrated by the cross-sectional view 600I of FIG. 6I, a second trench 604b is etched into the ILD 106 and the semiconductor substrate 102. The second trench 604b extends from a top surface of the first insulating layer 108 to a top surface of the metal interconnect structure 101, such that a portion of the metal interconnect structure 101 is exposed. In some embodiments, the etch removes all laterally extending portions of the dielectric layer 612.

Figure 6J:
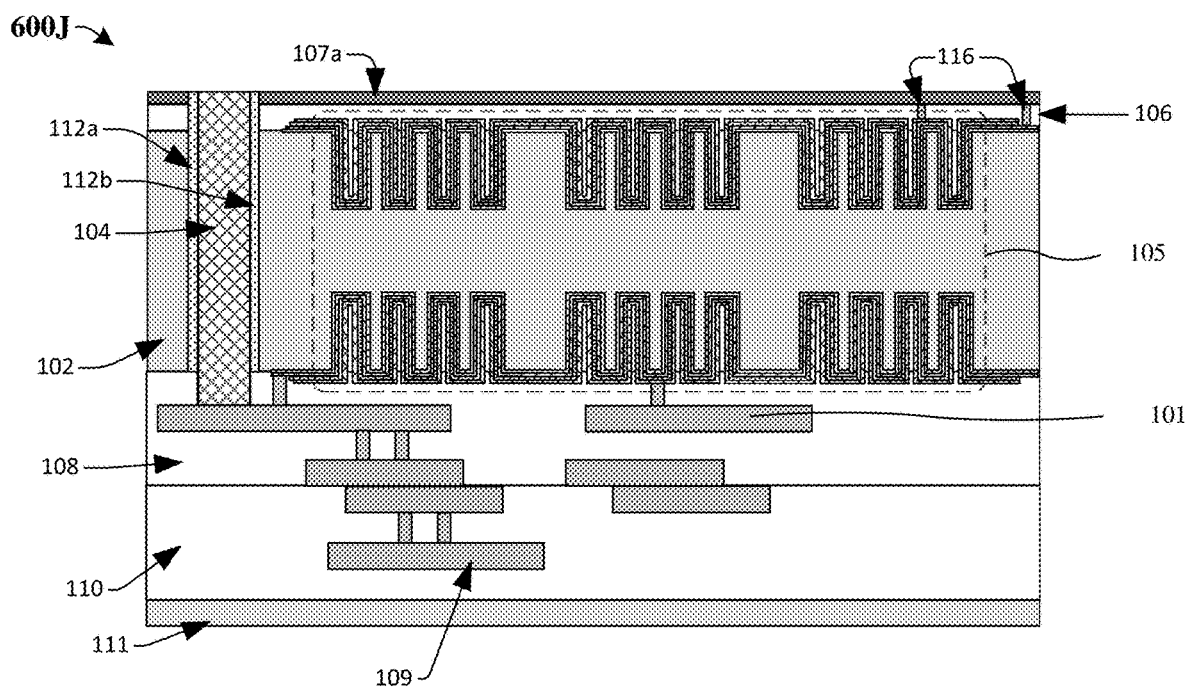

As illustrated by the cross-sectional view 600J of FIG. 6J, a through-substrate via (TSV) 104 is formed within the first trench 604a and the second trench 604b. The remaining portions of the dielectric layer 612 serve as isolation structures 112a and 112b to laterally separate the TSV 104 from the semiconductor substrate 102. In some embodiments, a top surface of the TSV 104 is above a top surface of the ILD 106. In some embodiments, a thin down process is done on the TSV 104. The TSV 104 may be formed by chemical vapor deposition, physical vapor deposition, electroplating, atomic-layer deposition, another suitable formation process, or any combination of the foregoing. The thin down process may be or otherwise comprise, for example, grinding, a Si dry etch, an alkali wet etch, a chemical-mechanical planarization process, some other suitable thin down process, or any combination of the foregoing.

Figure 6K:
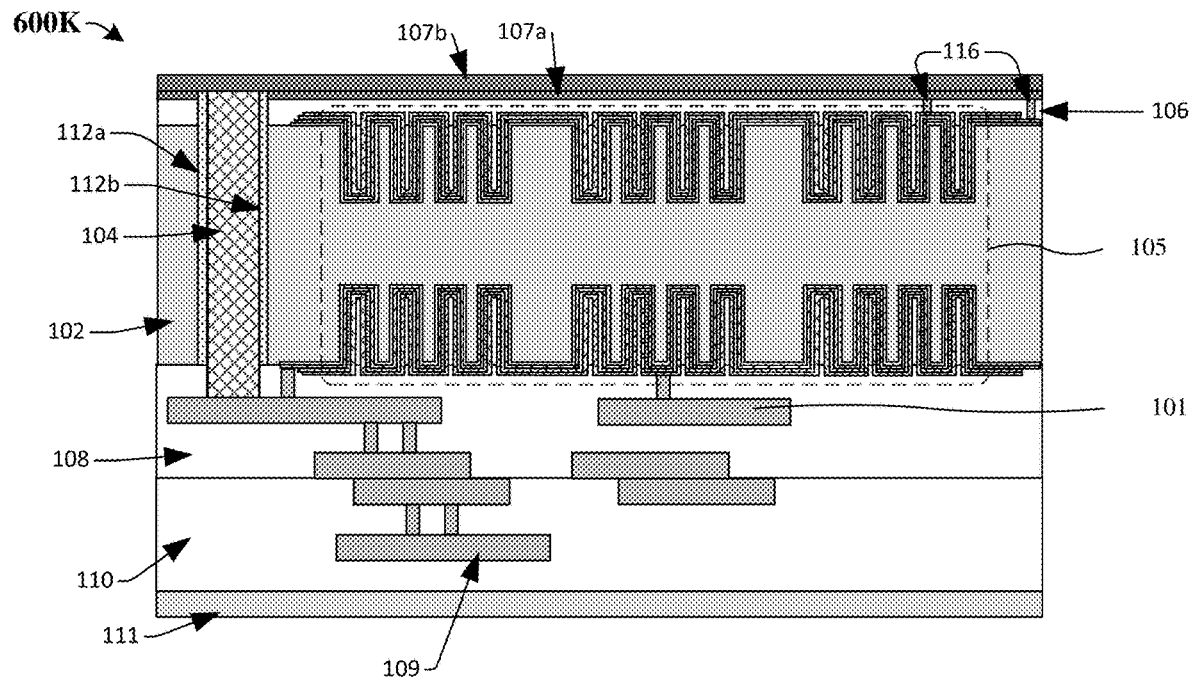

As illustrated by the cross-sectional view 600K of FIG. 6K, a second encapsulation layer 107b is formed over the first encapsulation layer 107a and the TSV 104. In some embodiments, a bottom surface of the second encapsulation layer 107b is above a top surface of the TSV 104. In some embodiments, a top surface of the TSV 104 is above a bottom surface of the first encapsulation layer 107a.

Figure 6L:
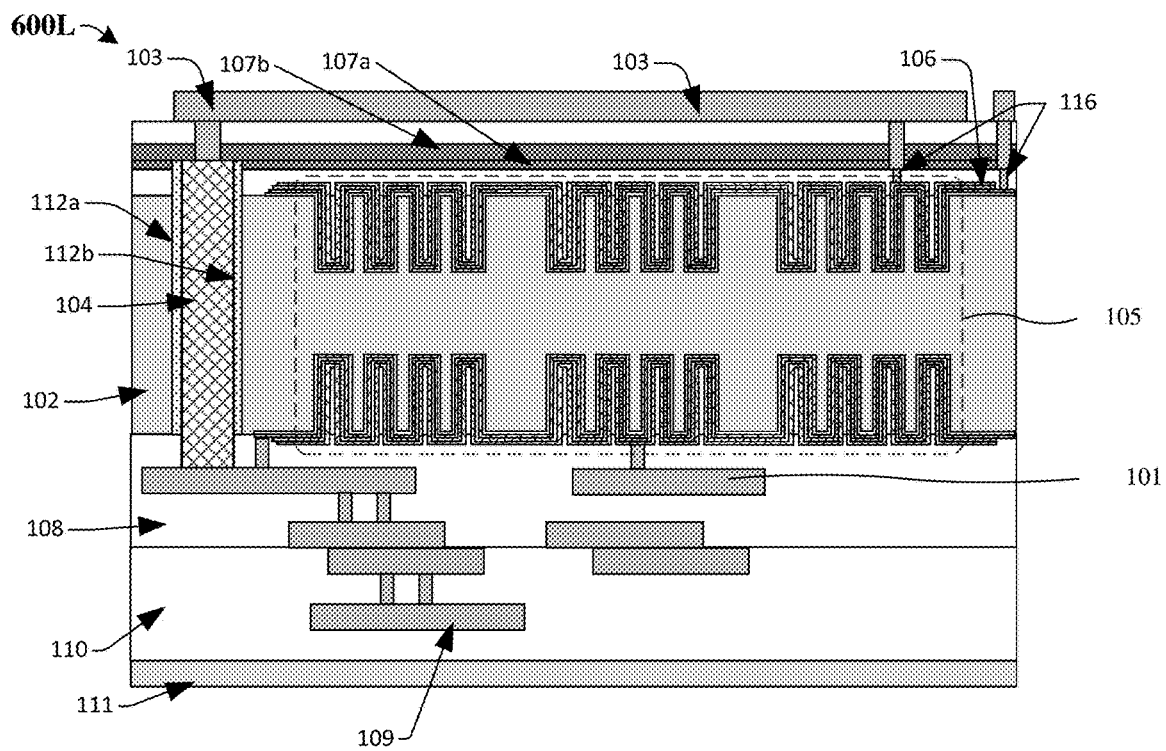

As illustrated by the cross-sectional view 600L of FIG. 6L, a metal interconnect structure 103 is formed over and within the ILD 106, the encapsulation layer 107, and the TSV 104, such that the metal interconnect structure 103 contacts the connecting vias 116 and the TSV 104. The TSV 104 electrically couples the metal interconnect structure 101 to the metal interconnect structure 103, and the metal interconnect structure 103 serves as a redistribution layer. In some embodiments, a third insulating layer 115 is formed above the second encapsulation layer 107b prior to forming the metal interconnect structure 103.

Figure 7:
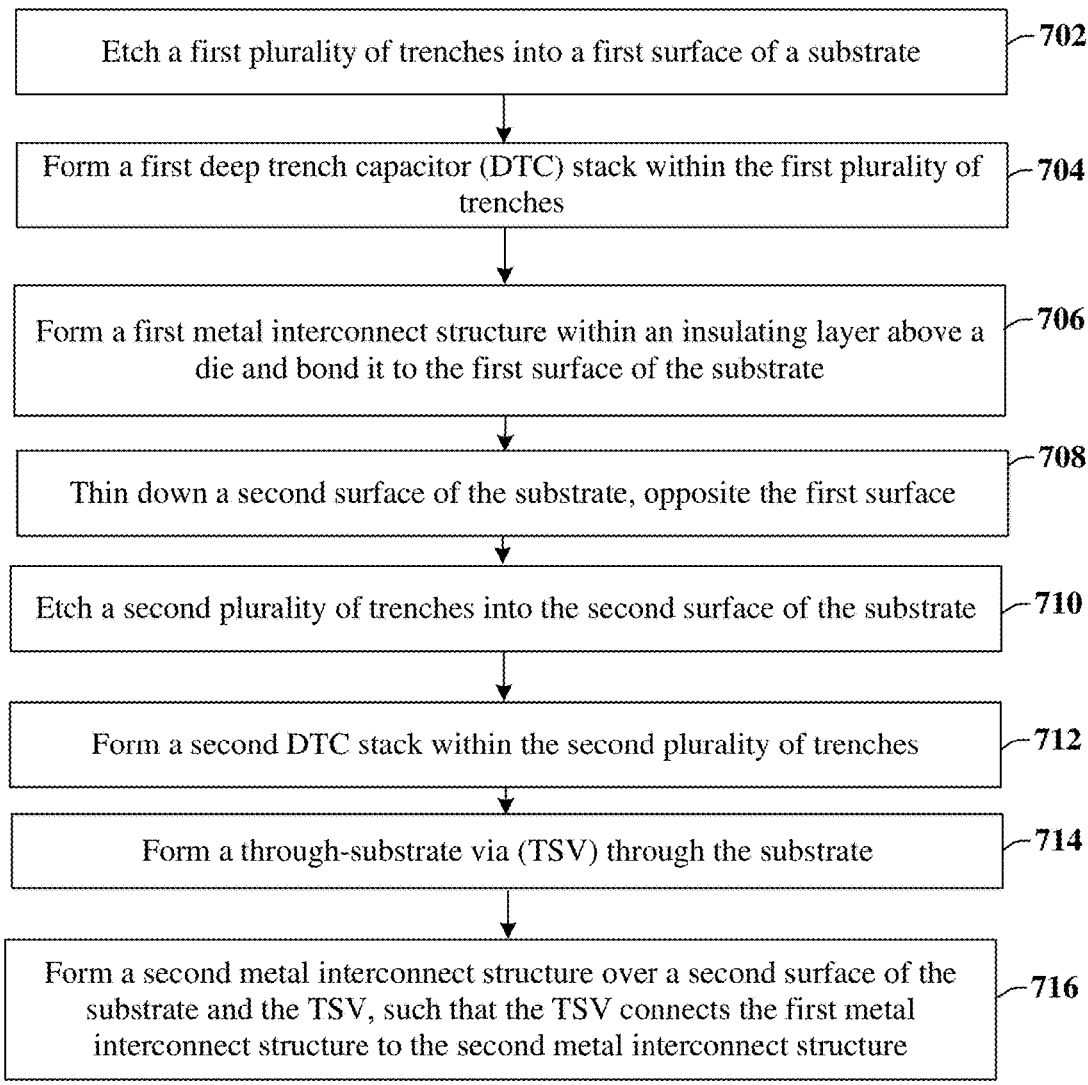
FIG. 7 illustrates a flowchart of some embodiments of the method consistent with FIGS. 6A-6L.

With respect to FIG. 7, a flowchart 700 of some embodiments of a method for forming an IC comprising stacked deep trench capacitor structure. The IC may, for example, correspond to the IC of FIGS. 6A-6L.

At 702, a first plurality of trenches is etched into a first surface of a semiconductor substrate. See, for example, FIG. 6A.

At 704, a first deep trench capacitor (DTC) stack is formed within the first plurality of trenches. See, for example, FIG. 6B.

At 706, a first metal interconnect structure is formed within an insulating layer above a die and bonded to the first surface of the semiconductor substrate. See, for example, FIG. 6C.

At 708, a second surface of the semiconductor substrate opposite the first surface is thinned down. See, for example, FIG. 6C.

At 710, a second plurality of trenches is etched into the second surface of the semiconductor substrate. See, for example, FIG. 6D.

At 712, a second DTC stack is formed within the second plurality of trenches. See, for example, FIG. 6E.

At 714, a through-substrate via (TSV) is formed through the semiconductor substrate. See, for example, FIG. 6J.

At 716, a second metal interconnect structure is formed over a second surface of the semiconductor substrate and the TSV, such that the TSV connects the first metal interconnect structure to the second metal interconnect structure. See, for example, FIG. 6L.

Accordingly, in some embodiments, the present disclosure relates to an integrated circuit (IC), including a first insulating layer which includes a first metal interconnect structure stacked above a bottom die. Including a substrate disposed above the first insulating layer, a second metal interconnect structure disposed above the substrate, a through-substrate via (TSV) directly connecting the first metal interconnect structure to the second metal interconnect structure, and a stacked deep trench capacitor (DTC) structure disposed in the substrate. The DTC structure includes a first plurality of trenches extending from a first side of the substrate and a second plurality of trenches extending from a second side of the substrate.

In other embodiments, the present disclosure relates to a method for building an integrated circuit (IC), including forming a first series of trenches on a first side of a substrate, and forming a first deep trench capacitor (DTC) stack within the first series of trenches. Also, after the first DTC stack has been formed, the method includes bonding the first side of the substrate to a first metal interconnect structure disposed on a carrier wafer, thinning down a second side of the substrate opposite the first side, etching a second series of trenches into the second side of the substrate, and forming a second DTC stack within the second series of trenches.

In yet other embodiments, the present disclosure relates to an integrated circuit (IC), including a first metal interconnect layer above a first substrate. Including a second substrate with a first surface bonded to the first metal interconnect layer, a second metal interconnect layer above the second substrate, a through-substrate via (TSV) directly connecting the first metal interconnect layer to the second metal interconnect layer, and a deep trench capacitor (DTC) structure disposed in the second substrate. The DTC structure includes one or more upper groups of one or more upper trenches extending from an upper side of the second substrate and one or more lower groups of one or more lower trenches extending from a lower side of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for building an integrated circuit (IC), comprising:
   forming a first series of trenches on a first side of a substrate, and forming a first deep trench capacitor (DTC) stack within the first series of trenches;
   after the first DTC stack has been formed, bonding the first side of the substrate to a first metal interconnect structure disposed on a carrier wafer;
   thinning down a second side of the substrate opposite the first side; and
   etching a second series of trenches into the second side of the substrate, and forming a second DTC stack within the second series of trenches;
   after the first side of the substrate is bonded to the first metal interconnect structure, forming a through-substrate via (TSV) through the substrate, wherein forming the TSV comprises:

etching a first trench into the substrate that extends from a first surface of the substrate to a second surface of the substrate;
forming a dielectric layer within the first trench and over the first surface of the substrate;
etching a second trench that extends from the second surface of the substrate to a top surface of the first metal interconnect structure; and
forming the TSV within the first and second trenches such that the TSV directly contacts the first metal interconnect structure; and
forming a second metal interconnect structure over the second side of the substrate and over the TSV, such that the TSV directly connects the first metal interconnect structure to the second metal interconnect structure.

2. The method of claim 1, further comprising forming an inter-layer dielectric over a first surface of the substrate prior to forming the second metal interconnect structure.

3. The method of claim 2, wherein after the TSV is formed, the inter-layer dielectric directly contacts outer sidewalls of the TSV.

4. The method of claim 1, wherein forming the first and second DTC stacks comprises:
forming an inner dielectric layer directly contacting the substrate;
forming an inner electrode;
forming a capacitor dielectric; and
forming an outer electrode.

5. The method of claim 1, wherein the first series of trenches comprises an equal number of trenches to the second series of trenches.

6. A method of forming an integrated circuit (IC), comprising:
forming a first series of trenches on a first side of a substrate;
forming a first insulating material in the first series of trenches, the first insulating material lining inner sidewalls and a bottom surface of the first series of trenches;
forming a first conductive material in the first series of trenches over the first insulating material, the first conductive material lining inner sidewalls and a bottom surface of the first insulating material within the first series of trenches;
after the first conductive material has been formed, bonding the first side of the substrate to a first metal interconnect structure disposed on a carrier wafer;
after the bonding, thinning a second side of the substrate opposite the first side; and
etching a second series of trenches into the second side of the substrate;
etching a trench into the substrate;
forming a dielectric layer within the trench;
extending the trench to remove a portion of the dielectric layer and expose a top surface of the first metal interconnect structure; and
forming a through-substrate via (TSV) within the trench to contact the top surface of the first metal interconnect structure.

7. The method of claim 6, further comprising:
forming a second insulating material in the second series of trenches, the second insulating material lining inner sidewalls and a bottom surface of the second series of trenches; and
forming a second conductive material in the second series of trenches over the second insulating material, the second conductive material lining inner sidewalls and a bottom surface of the second insulating material within the second series of trenches.

8. The method of claim 6, further comprising:
forming a second metal interconnect structure over the second side of the substrate.

9. The method of claim 6, further comprising:
forming a second metal interconnect structure over the second side of the substrate and over the TSV, such that the TSV directly connects the first metal interconnect structure to the second metal interconnect structure.

10. The method according to claim 9, wherein an upper lateral portion of the first conductive material overlies an outermost surface of the first side of the substrate.

11. The method according to claim 9, further comprising:
an inter-layer dielectric disposed over the substrate, directly contacting outer sidewalls of the TSV; and
an encapsulation layer disposed directly over the inter-layer dielectric.

12. The method according to claim 9, wherein an uppermost surface of the TSV is above an uppermost surface of the substrate.

13. The method according to claim 6, wherein the substrate continuously extends from the first series of trenches to the second series of trenches.

14. A method for building an integrated circuit (IC), comprising:
forming a first series of trenches on a first side of a semiconductor substrate, and forming a first deep trench capacitor (DTC) stack within the first series of trenches;
after the first DTC stack has been formed, bonding the first side of the semiconductor substrate to a first metal interconnect structure disposed on a carrier wafer;
thinning down a second side of the semiconductor substrate opposite the first side;
etching a second series of trenches into the second side of the semiconductor substrate, and forming a second DTC stack within the second series of trenches;
wherein the first DTC stack and the second DTC stack have an overall thickness ranging from 1 micrometer to 500 micrometers;
forming a through-substrate via (TSV) through the semiconductor substrate;
forming an inter-layer dielectric over the second side of the semiconductor substrate, wherein the inter-layer dielectric directly contacts outer sidewalls of the TSV; and
forming a first encapsulation layer directly over the inter-layer dielectric, wherein the first encapsulation layer completely overlies the semiconductor substrate.

15. The method of claim 14, further comprising:
forming a second metal interconnect structure over the second side of the semiconductor substrate and over the TSV, such that the TSV directly connects the first metal interconnect structure to the second metal interconnect structure;
wherein the TSV is formed after the first side of the semiconductor substrate is bonded to the first metal interconnect structure.

16. The method of claim 15, further comprising forming an inter-layer dielectric over a first surface of the semiconductor substrate prior to forming the second metal interconnect structure.

17. The method of claim 14, further comprising forming a second encapsulation layer over the first encapsulation layer.

18. The method of claim 17, wherein a bottom surface of the second encapsulation layer is above a top surface of the TSV.

19. The method of claim 17, further comprising forming a second metal interconnect structure over and within the inter-layer dielectric and the first and second encapsulation layers.

20. The method of claim 15, wherein forming the TSV comprises:
- etching a first trench into the semiconductor substrate that extends from the first side to the second side of the semiconductor substrate;
- forming a dielectric layer within the first trench and over the first side of the semiconductor substrate;
- etching a second trench that extends from the second side of the semiconductor substrate to a top surface of the first metal interconnect structure; and
- forming the TSV within the first and second trenches such that the TSV directly contacts the first metal interconnect structure.

* * * * *